Figure 1:
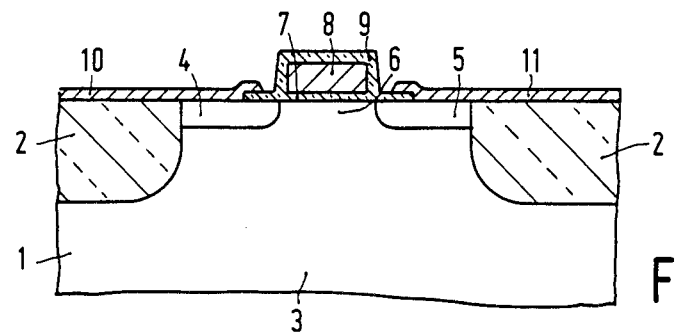
Figure 2:
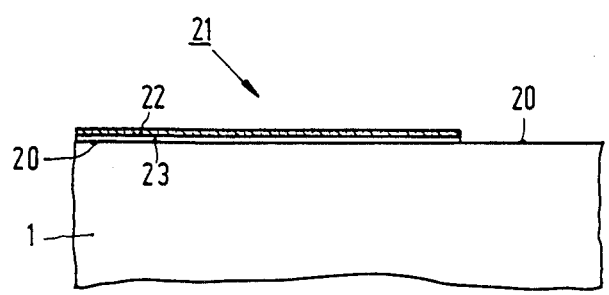

United States Patent [19]

Dil et al.

[11] Patent Number: 4,622,096
[45] Date of Patent: Nov. 11, 1986

[54] METHOD OF MANUFACTURING A SEMICONDUCTOR DEVICE COMPRISING A SILICON BODY, IN WHICH A SUNKEN OXIDE LAYER IS LOCALLY PROVIDED

[75] Inventors: Jan G. Dil; Johan W. Bartsen, both of Eindhoven, Netherlands

[73] Assignee: U.S. Philips Corporation, New York, N.Y.

[21] Appl. No.: 729,843

[22] Filed: May 2, 1985

[30] Foreign Application Priority Data

May 29, 1984 [NL] Netherlands ............ 8401711

[51] Int. Cl.$^4$ .............. H01L 21/306; B44C 1/22; C03C 15/00; C03C 25/06
[52] U.S. Cl. .................. 156/643; 29/571; 29/576 W; 29/580; 156/646; 156/648; 156/653; 156/657; 156/659.1; 156/662; 252/79.1; 357/23.1; 357/41; 357/49; 427/93
[58] Field of Search .................. 427/93-95; 29/571, 576 W, 580; 156/643, 646, 648, 650-653, 657, 659.1, 661.1, 662; 252/79.1; 357/23.1, 41, 49

[56] References Cited

U.S. PATENT DOCUMENTS 4,533,429  8/1985  Josquin ............ 29/576 W

Primary Examiner—William A. Powell
Attorney, Agent, or Firm—Paul R. Miller

[57] ABSTRACT

The method of the present invention involves the forming of a depression with sidewalls extending below a first oxidation mask provided on a surface of a silicon body. Subsequently, after the sidewalls of the depression have been provided with a second oxidation mask, an oxidation treatment is carried out. According to the invention, the depression is provided in such a manner that the sidewalls of the depression are flat and form an angle of 25° to 45° with the original surface of the silicon body. The second oxidation mask is formed by a 5 to 50 nm thick layer of silicon nitride or silicon oxinitride applied directly or separated from the surface by a layer of silicon oxide having a thickness of less than 5 nm. This leads to a very flat structure.

10 Claims, 8 Drawing Figures

METHOD OF MANUFACTURING A SEMICONDUCTOR DEVICE COMPRISING A SILICON BODY, IN WHICH A SUNKEN OXIDE LAYER IS LOCALLY PROVIDED

The invention relates to a method of manufacturing a semiconductor device comprising a silicon body, in which a sunken oxide layer is locally provided, in which method, after a first oxidation mask has been locally provided on a surface of the silicon body, a depression with side walls extending at least in part below the first oxidation mask is formed in the silicon body, whereupon the silicon body is subjected to an oxidation treatment after a second oxidation mask adjoining the first oxidation mask has been provided on the side walls of the depression.

Such a method is particularly suitable for the manufacture of semiconductor devices, in which a large number of circuit elements, such as transistors and diodes, are present in a silicon body. These circuit elements can be insulated from each other by means of the oxide layer, while electrical connections between these circuit elements can be established in a simple manner because the oxide layer is then present in the silicon body as a sunken layer. These electrical connections are then formed on a comparatively flat surface.

U.S. Pat. No. 3,958,040 discloses a method of the kind mentioned in the opening paragraph, in which two possibilities are indicated to form the depression in the silicon body. A first possibility is to subject the silicon body, after the first oxidation mask has been provided, to an etching treatment. The second possibility is to subject the silicon body, after the first oxidation mask has been provided, to an oxidation treatment and to subsequently etch away the oxide thus formed. In the known method the depression formed in the silicon body preferably extends to below the first oxidation mask. As a result, it is possible in a simple manner to provide a second oxidation mask on the side walls of the depression without the use of an additional mask. In the known method, after the depression has been formed, for this purpose the whole surface is successively covered by a layer of material, from which the oxidation mask will be manufactured, and a layer of photosensitive lacquer. In a subsequent exposure step without the use of a mask, the whole quantity of photo-sensitive lacquer is made soluble in a developer except at the areas on the side wall of the depression which are located in the shadow below the first oxidation mask. After development, only a lacquer layer on the side walls thus remains. During a subsequent etching treatment, the entire layer of the material, from which the second oxidation mask is manufactured, is removed except at the areas covered by lacquer. Thus, the second oxidation mask is formed in a simple manner. During the then following oxidation treatment, the sunken oxide layer is formed and the second oxidation mask is also converted into oxide.

By the known method described, a sunken oxide layer is formed, which has a much flatter form at its edges than would have been the case if the masking of the side walls of the depression in the silicon body had not been used. For this purpose it is preferable for the second oxidation mask to have such a thickness and composition that it is also converted into oxide during the formation of the sunken oxide layer. This requires a very accurate process control.

The invention has for its object to provide a method of the kind mentioned in the opening paragraph, by means of which a sunken oxide layer of comparatively flat form can be formed in a silicon body in a comparatively simple less critical manner.

The invention is based on the recognition of the fact that this object can be achieved by a suitable choice of the shape of the side walls of the depression and of thickness and composition of the second oxidation mask.

According to the invention, the method mentioned in the opening paragraph is characterized in that the depression is provided in a manner such that its side walls have a comparatively flat surface which encloses an angle of 25° to 45° with the original surface of the silicon body, and in that the second oxidation mask is formed by a 5 to 50 nm thick layer of silicon nitride or silicon oxynitride which is applied to the side wall of the depression directly or separated therefrom by a silicon oxide layer having a thickness of less than 5 nm. A layer of silicon oxynitride is to be understood here and in the following description to mean a layer which is obtained, for example, during a simultaneous deposition of silicon nitride and silicon dioxide and which can be indicated by the chemical formula $SiO_xN_y$. Such a layer can be considered as a layer of silicon nitride, which also contains oxygen. The ratio x:y is preferably smaller than 0.5. Furthermore, it is emphasized that the term "silicon oxide" is to be understood to include all possible compounds of silicon and oxygen and is not limited to the compound silicon dioxide.

If a silicon body, which is locally covered by an oxidation mask having a thickness and a composition in accordance with the invention, is subjected to an oxidation treatment, an oxide layer is formed, which is located for approximately half its thickness in the silicon body and which extends to below the oxidation mask. The oxidation mask is pressed upwards during the oxidation treatment at the edge of the forming oxide layer. The part of the oxide layer located below the oxidation mask has a flat transition both with the oxidation mask and with the silicon body, while both transitions enclose an angle with the original surface of the silicon body, which, depending upon further treatments, has a value of 25° to 45°. If such an oxidation mask in accordance with the invention is used as the second oxidation mask on the side walls of the depression in the silicon body, the oxide layer formed will also have pressed upwards this oxidation mask and the oxide below this oxidation mask will also form a flat transition with this mask and with the silicon body. These transitions now enclose the same angle of 25° to 45° with the original side walls. When the side walls of the depression enclose, in accordance with the invention, an angle lying between 25° and 45° with the original surface of the silicon body and when the oxidation is carried out in a manner such that the oxide encloses with the side walls an equally large angle, it is found that the oxide layer thus formed has a substantially flat surface when the depression is just filled with oxide. Thus, the desired sunken oxide layer is formed in a simple manner, while the thickness of the oxidation mask for obtaining the desired oxide profile can vary within comparatively wide limits.

The depression in the silicon body may be formed in different ways. For example, after the first oxidation mask has been provided, the silicon body may be subjected at a surface thereof to a preferential etching treatment, as a result of which the side walls of the depression are formed by crystal surfaces of the silicon body. However, there is a possibility that the side walls then are not entirely flat, but have ridges. During further processing steps, these ridges may give rise to mechanical stresses and dislocations. Preferably, the method according to the invention of forming the depression is, however, characterized in that the depression is formed by subjecting the silicon body, after the first oxidation mask has been provided, to an oxidation treatment and subsequently removing the oxide thus formed, the first oxidation mask being constituted by a 5 to 50 nm thick layer of silicon nitride or silicon oxynitride which is applied to the surface of the silicon body directly or separated therefrom by a layer of silicon oxide having a thickness of less than 5 nm. During the oxidation treatment, an oxide layer is formed which extends to below the first oxidation mask and forms in situ with the first oxidation mask and with the silicon body flat transitions, which enclose with the original surface an angle which, depending upon further treatments, has a value between 25° and 45°. After the oxide has been removed, the desired depression is obtained.

A further preferred embodiment of the method according to the invention is characterized to provide the second oxidation mask after the depression has been formed, the silicon body is, covered successively by a 10 to 50 nm thick layer of silicon nitride or silicon oxynitride and a layer of silicon oxide and is then subjected to an anisotropic etching treatment in which the layer of silicon oxide is removed except below edges of the first oxidation mask projecting above the depression, whereupon exposed silicon nitride or silicon oxynitride is subjected to an etching treatment until the depression has an uncovered bottom, after which remaining silicon oxide is removed. Thus, it is achieved that the side walls are covered by the desired second oxidation mask without the use of an additional mask being required. The edge of the first oxidation mask projecting above the depression is used as a mask. It is very practical to etch away anisotropically the layer of silicon oxide in a plasma produced in a gas containing $CF_3H$ and Ar and the layer of silicon nitride or silicon oxynitride in hot phosphoric acid.

Preferably, the method according to the invention is characterized in that the layer of silicon nitride or silicon oxynitride of the second oxidation mask is formed by passing over the silicon body at a temperature of 800° to 850° C. and a pressure of 10 to 50 Pa, a reaction gas which contains ammonia, dichlorosilane and laughing gas for forming silicon oxynitride. If the oxidation masks comprise such a layer of silicon nitride or silicon oxynitride, the oxide then formed has the desired form described above, in which the occurrence of dislocations in the silicon body, which could be formed by mechanical stresses produced during oxidation, is substantially completely avoided.

If the silicon body is treated before deposition of the layer of silicon nitride or silicon oxynitride in a 60 to 70% solution of fuming nitric acid, a layer of silicon oxide having a thickness of less than 5 nm is formed on the silicon body. A thin layer of silicon oxide is then present between the silicon body and the layer of silicon nitride or silicon oxynitride. The sunken oxide layer formed has the desired profile described in the foregoing, while due to the presence of the thin oxide layer the occurrence of mechanical stresses during oxidation is further reduced.

If the oxidation treatment is carried out in the presence of the silicon oxide layer of at most 5 nm thickness between the layer of silicon nitride or silicon oxynitride and the silicon body by passing steam over the silicon body at a temperature of 800° to 1100° C. and a pressure of 1 to 20 atm. with up to 50% by volume of oxygen added thereto, it is a surprise to find that the values of the angles the flat transitions between the oxide and the oxidation mask on the one hand and the silicon body on the other hand enclose with the side walls of the depression or with the original surface depend upon the quantity of added oxygen. The angles decrease with an increasing oxygen concentration from about 35° to about 25°. By the choice of the quantity of added oxygen, the angle that the transition between the sunken oxide and the silicon body encloses with the surface can be adjusted within certain limits. Since by addition of oxygen it is moreover achieved that the edges of the oxidation masks are forced upwardly less abruptly, the occurrence of dislocations due to mechanical stresses is reduced also in this manner.

If before deposition of the layer of silicon nitride or silicon oxynitride, but after treatment in fuming nitric acid, the semiconductor body is subjected to a heat treatment at a temperature of 800° to 1200° C. in an ammonia-containing atmosphere, the layer of silicon oxide then present on the silicon surface is then converted at least in part into silicon nitride. The angles that the transitions between oxide and silicon on the one hand and oxidation mask on the other hand enclose with the original silicon surface or with the side walls of the depression, then lie, depending upon the duration of the treatment, between 25° and 45°. In the case of a complete conversion of the layer of silicon oxide, this angle is 45°.

An embodiment of the invention will be described hereinafter more fully, by way of example, with reference to the drawing. In the drawing:

FIG. 1 shows a cross-section of a semiconductor device comprising a silicon body, in which a sunken oxide layer is locally provided, and FIG. 2 to FIG. 8 inclusive show successive stages of the manufacture of the semiconductor device shown in FIG. 1 by means of the method according to the invention.

The figures are schematical and not drawn to scale; transverse dimensions especially are strongly exaggerated. In the figures, the same reference numerals are used for corresponding parts.

FIG. 1 shows a semiconductor device comprising a silicon body 1, in which a sunken oxide layer 2 having a thickness of 100 to 500 nm is locally provided. All kinds of circuit elements may be present in the part 3 of the silicon body 1 bounded and by the sunken oxide layer 2, by way of example a MOS transistor is provided therein. This transistor comprises semiconductor zones 4 and 5 of a first conductivity type forming a source and drain, respectively, and a semiconductor zone 6 of the second opposite conductivity type, forming a channel zone. A gate electrode 8 of, for example, polycrystalline silicone is located above the channel zone 6 but separated therefrom by an oxide layer 7 having a thickness of about 50 nm and consisting, for example, of silicon oxide. This gate electrode is in turn provided with an insulating layer 9 of, for example, silicon oxide. The source and drain zones 4 and 5 are contacted by electrodes 10 and 11 of, for example, aluminum. If several such transistors and also other circuit elements are present in the semiconductor body 1, these elements can be interconnected in a simple manner because the insulating oxide layers 2 are provided as sunken layers.

Figure 4:
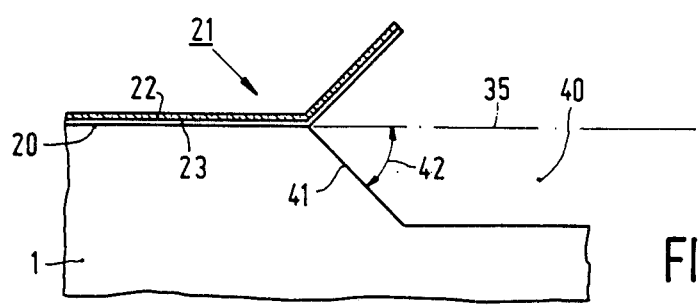
Figure 7:
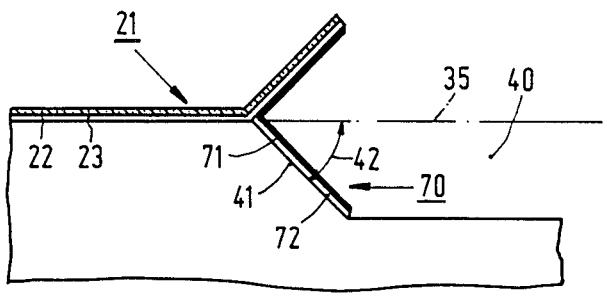
Figure 8:
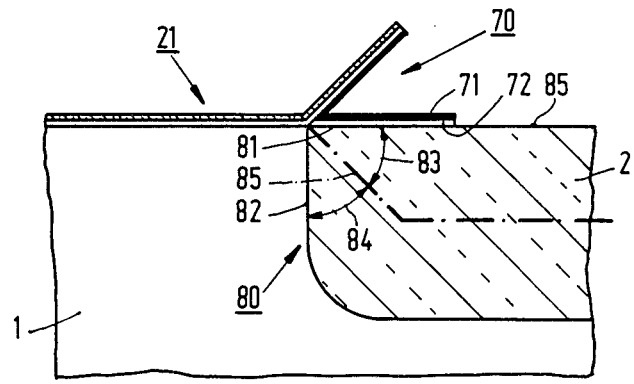

In the method of manufacturing the semiconductor device comprising a silicon body 1, in which a sunken oxide layer 2 is locally provided, a first oxidation mask 21 is formed on a surface 20 of the silicon body 1 (FIG. 2), after which a depression 40 with side walls 41 extending at least in part below the first oxidation mask 21 is formed (FIG. 4). After a second oxidation mask 70 adjoining the first oxidation mask 21 has been formed on the side walls 41 of the depression 40 (FIG. 7), the silicon body 1 is subjected to an oxidation treatment. The desired oxide layer 2 is then formed (FIG. 8). In accordance with the invention, the depression 40 is provided in a manner such that the side walls 41 thereof have a substantially flat surface which encloses an angel 42 of 25° to 45° with the original surface of the silicon body 1 indicated by a line 35 (FIG. 4). Furthermore, the second oxidation mask 70 is formed by a 5 to 50 nm thick layer 71 of silicon nitride or silicon oxynitride, which is applied to the side wall 41 of the depression 40 directly or separated therefrom by a layer 72 of silicon oxide having a thickness of less than 5 nm (FIG. 7). A layer of silicon oxynitride is to be understood to mean a layer which is obtained, for example, during a simultaneous deposition of silicon nitride and silicon oxide and which can be indicated by the chemical formula $SiO_xN_y$. Such a layer can be considered as a layer of silicon nitride containing oxygen. Preferably, the ratio x:y is smaller than 0.5; in this case, the masking effect during oxidation of the silicon body 1 is substantially equal to that of a layer of silicon nitride of the same thickness and the layer can be etched in the same manner as the layer of silicon nitride in, for example, hot phosphoric acid. The layer of silicon oxide 72 may comprise all kinds of compounds of silicon and oxygen, among them silicon dioxide.

During the oxidation treatment the oxidation mask 70 is pressed upwardly at the edge 80 of the oxide layer 2 being formed (FIG. 8). The oxide layer 2 formed constitutes with the mask 21 and with the silicon body 1 near the edge 80 flat transitions 81 and 82 which enclose angles 83 and 84 with the original side walls indicated by a line 85 and which, depending upon further treatments, have a value of 25° to 45°. The oxidation can consequently be carried out in a manner such that the oxide 2 encloses with the side walls 85 of the depression 40 angles 83 and 84, which are equal to the angle 42 that the original side walls 41 enclose with the original surface 35. It is then found that, when the depression 40 during oxidation is just filled with oxide, a substantially flat surface 85 is obtained. The desired oxide layer 2 can thus be formed in a simple manner, while the thickness of the oxide mask 40 can vary between comparatively wide limits (of 5 to 50 nm).

Figure 3:
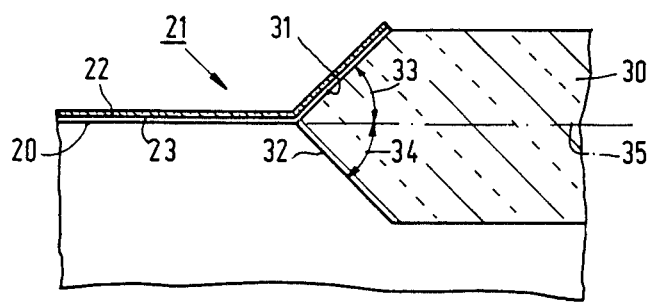

The depression 40 is formed in accordance with the invention by subjecting the silicon body 1, after the first oxidation mask 21 has been formed, to an oxidation treatment and then removing the oxide 30 thus formed (FIG. 3), for example by means of an etching treatment in a hydrofluoride solution. The oxidation mask 21 is then formed by a 5 to 50 nm thick layer 22 of silicon nitride or silicon oxynitride, which is applied directly or separated therefrom by a layer 23 of silicon oxide having a thickness of less than 5 nm to the surface 20 of the silicon body 1. The oxide 30 formed has flat transitions 31 and 32 with the oxidation mask 21 and the silicon body 1. These transitions 31 and 32 enclose angles 33 and 34 with the original surface indicated by a line 35 (FIG. 3). The value of the angles 33 and 34 depends, as will appear below, upon further treatments and lies between 25° and 45°.

When oxidation mask 21 with or without the same oxide layer 23 is used for the formation of the oxide 30 and for the formation of the oxide 2, respectively, and the oxidation is effected by means of the same oxidation treatment, the condition that the angles 33, 34, 83 and 84 are equal to each other is automatically satisfied. After the oxide 30 has been removed, the depression 40 is obtained, the wall 41 of which encloses the angle 42 with the original surface 35; this angle 42 is equal to the angle 34. Since the angle 42 is also equal to the angle 83, the flat surface 85 is automatically obtained.

Figure 5:
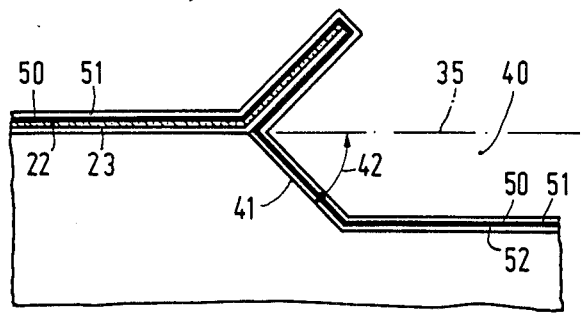
Figure 6:
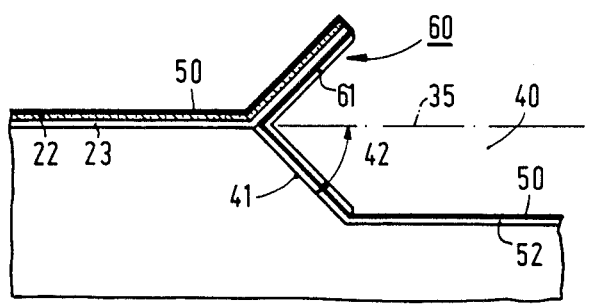

The second oxidation mask 70 is formed in accordance with the invention, after the depression 40 has been provided by successively covering the silicon body 1 with a 5 to 50 nm thick layer 50 of silicon nitride or silicon oxynitride and a layer 51 of silicon oxide (FIG. 5). Below the layer 50 of silicon nitride or silicon oxynitride, a less than 5 nm thick layer 52 of silicon oxide can also be formed within the depression 40. Subsequently, the layer of silicon oxide 51 is removed, except below edges 60 of the first oxidation mask (22, 23) projecting above the depression 40, by an anisotropic etching treatment—preferably in a plasma produced in a gas containing $CF_3H$ and Ar. The remaining part of the silicon oxide layer 61 is then used as a mask during a following fetching treatment—preferably in hot phosphoric acid—, in which the silicon nitride or silicon oxynitride 50 then exposed is removed over such a distance that the depression 40 has a bottom not covered by silicon nitride or silicon oxynitride. For this etching treatment it is very practical if the layer 22 has a thickness of 20 to 50 nm and the layer 52 has a thickness of 10 to 20 nm. Consequently, the risk is avoided that holes are formed in the layer 22 during the etching treatment. Subsequently, the remaining exposed oxide 61, 52 is removed. Thus, the second oxidation mask 70 is formed without the use of additional masking steps (FIG. 7); the edge 60 of the first oxidation mask 21 is used as a mask.

The first and second oxidation masks 21 and 70, respectively, are formed in accordance with the invention by passing, at a temperature of 800° to 850° C. and a pressure of 10 to 50 Pa, a reaction gas over the silicon body 1. The reaction gas contains ammonia and dichlorosilane and, if silicon oxynitride has to be formed, it also contains laughing gas. If the oxidation masks 21 and 70 are thus formed, the oxide 30 and 2, respectively, then formed has the desired shape with flat transitions 31 32 and 81, 82, the angles 33, 34 and 83, 84 of 25° to 45° enclose with the original surface 35 and the original side wall 85, respectively. The occurrence of dislocations, which could be formed due to mechanical stresses produced during oxidation, is substantially completely avoided with the use of the oxidation treatment to be described below. Preferably, a volume of laughing gas is included in the reaction gas which is at most six times larger than that of ammonia. Thus, silicon oxynitride is formed according to the chemical formula $SiO_xN_y$, in which the ratio x:y is smaller than 0.5.

The occurrence of mechanical stresses can be reduced even further when before the deposition of the layers of silicon nitride or silicon oxynitride 22 and 50 the silicon body 1 is treated in a 60 to 70% solution of fuming nitric acid. A less than 5 nm thick layer of silicon oxide 23 and 52, respectively, is then formed on the silicon body 1. If in the presence of the layers of silicon oxide 23 and 52 the oxidation treatment is carried out such that at a temperature of 800° to 1100° C. and a pressure of 1 to 20 atm. steam, to which up to 50% by volume of oxygen is added, is passed over the silicon body, it is found that the values of the angles 33, 34 and 83, 84 depend upon the quantity of added oxygen. The angles 33, 34 and 83, 84 decrease with an increasing oxygen concentration from about 35° to about 25°. By the choice of the quantity of oxygen, the angle that the transition 82 between the sunken oxide 2 and the silicon body 1 encloses with the surface 35, which is the sum of the angles 83 and 84, can be adjusted within given limits. Since by addition of oxygen it is achieved that the edges ofthe oxidation masks 21 and 70 are forced upwards less abruptly, the occurrence of dislocations due to mechanical stresses is reduced also in this manner. It is presumed that by the addition of oxygen to the steam, nitridation of the oxide layers 23 and 70 is counteracted. By reaction of steam with silicon nitride or silicon oxynitride in the layers 22 and 71 of the oxidation masks 21 and 70, reactive nitrogen-hydrogen compounds are formed, which are capable of converting the oxide layers 23 and 72 near the edge of the oxidation masks 21 and 70 into nitride. Thus, a nitride ribbon (a so-called white ribbon) is formed, which prevents the silicon body 1 below the oxidation mask 21, 70 from being converted during the oxidation treatment into oxide. Since oxygen reacts very easily with nitrogen-hydrogen compounds, by addition thereof the formation of the nitrogen ribbon and hence the oxidation-preventing effect by this ribbon is reduced. It should further be noted that such a nitride ribbon has a thickness up to about 5 nm so that by the choice of the thickness of the oxide layers 23 and 72 (of less than 5 nm) it is achieved that the closure by the nitride ribbon at the edge of the oxidation masks 21 and 70 is an optimum.It should be noted that the occurrence of dislocations can also be reduced when the oxidation is carried out slowly, which may be effected, for example, by reducing the partial pressure of the steam, for example, by adding an inert gas to the steam-oxygen mixture.

If before deposition of the layer of silicon nitride or silicon oxynitride 22 and 50, respectively, but after treatment in fuming nitric acid, in which the oxide layers 23 and 52 were formed, the semiconductor body 1 is subjected to a heat treatment at a temperature of 800° to 1200° C. in an ammonia-containing atmosphere, the layers of silicon oxide 23 and 52 are converted at least in part into silicon nitride. The angles that the transitions 31, 32 and 81, 82 then enclose with the original surface 35 and with the original side walls 41 or 85 of the depression 40, respectively, then lie, depending upon the duration of the nitridation treatment, between 25° and 45°. If the layers of silicon oxide 23 and 52 are entirely converted into silicon nitride (in which event the oxidation masks 21 and 70 consist of layers of silicon nitride or silicon oxynitride, which are directly applied to the surface 20 or the side walls 41) these angles are 45° and the angle that the transition 82 between the sunken oxide 2 and the silicon body 1 encloses with the surface 35 becomes 90°. Thus, it is achieved that the distance over which the oxide layer 30—and hence in fact also the sunken oxide layer 2-has penetrated below the oxidation mask 21 is a minimum.

Finally, the remaining parts of the oxidation masks 21 and 70 are removed. In a usual manner, for example the transistor shown in FIG. 1 is then provided in the structure thus formed.

It is a matter of course that the invention is not limited to the embodiment described, but that many variations are possible for those skilled in the art without departing from the scope of the invention.

What we claim is:

1. A method of manufacturing a semiconductor device comprising a silicon body, in which a sunken oxide layer is locally provided, in which method, after a first oxidation mask has been locally provided on a surface of the silicon body, a depression with side walls extending at least in part below the first oxidation mask is formed in the silicon body, whereupon the silicon body is subjected to an oxidation treatment after a second oxidation mask adjoining the first oxidation mask has been provided on the side walls of the depression, characterized in that the depression is provided with side walls having a comparatively flat surface at an angle of 25° to 45° with the original surface of the silicon body, and in that the second oxidation mask is formed by a 5 to 50 nm thick layer of silicon nitride or silicon oxynitride applied to the side wall of the depression directly or separated therefrom by a silicon oxide layer having a thickness of less than 5 nm.

2. A method as claimed in claim 1, characterized in that the depression is formed by subjecting the silicon body, after the first oxidation mask has been provided, to an oxidation treatment and then removing the oxide thus formed, the first oxidation mask being constituted by a 5 to 50 nm thick layer of silicon nitride or silicon oxynitride applied to the surface of the silicon body directly or separated therefrom by a layer of silicon oxide having a thickness of less than 5 nm.

3. A method as claimed in claim 1 or 2, characterized in that to provide the second oxidation mask after the depression has been formed, the silicon body is successively covered by a 5 to 50 nm thick layer of silicon nitride or silicon oxynitride and a layer of silicon oxide and in that the silicon body is then subjected to an anisotropic etching treatment in which the layer of silicon oxide is removed except below the edges of the first oxidation mask projecting above the depression, and the exposed silicon nitride or silicon oxynitride is subjected to an etching treatment until the depression has an uncovered bottom, after which remaining silicon oxide is removed.

4. A method as claimed in claim 3, characterized in that the first oxidation mask is provided in a thickness of 20 to 50 nm and the second oxidation mask is provided in a thickness of 10 to 20 nm.

5. A method as claimed in claim 3, characterized in that the layer of silicon oxide is etched away anisotropically in a plasma produced in a gas containing $CF_3H$ and Ar, and the layer of silicon nitride or silicon oxynitride is etched away in hot phosphoric acid.

6. A method as claimed in claim 1 or claim 2, characterized in that the layer of silicon nitride or silicon oxynitride of the first and second oxidation masks is formed by passing over the silicon body at a temperature of 800° to 850° C. and a pressure of 10 to 50 Pa, a reaction gas which contains ammonia, dichlorosilane and laughing gas for the formation of silicon oxynitride.

7. A method as claimed in claim 6, characterized in that in the reaction gas a volume of said laughing is included which is at most six times larger than that of ammonia.

8. A method as claimed in claim 6, characterized in that before deposition of the layer of silicon nitride or silicon oxynitride the silicon body is treated in a 60 to 70% solution of fuming nitric acid.

9. A method as claimed in claim 8, characterized in that before deposition of the layer of silicon nitride or silicon oxynitride, but after treatment in nitric acid, the semiconductor body is subjected to a heat treatment at a temperature of 800° to 1200° C. in an ammonia-containing atmosphere.

10. A method as claimed in claim 1 or claim 2, characterized in that the oxidation treatment is carried out by passing steam over the silicon body at a temperature of 800° to 1100° C. and a pressure of 1 to 20 atm. with up to 50% by volume of oxygen added.

* * * * *

UNITED STATES PATENT AND TRADEMARK OFFICE
CERTIFICATE OF CORRECTION

PATENT NO. : 4622096
DATED : Nov. 11, 1986
INVENTOR(S) : Jan G. Dil ET AL

It is certified that error appears in the above-identified patent and that said Letters Patent is hereby corrected as shown below:

Col. 4, line 60, Change "silicone" to --silicon--

Col. 5, Line 17, change "angel" to --angle--

Signed and Sealed this

Tenth Day of November, 1987

Attest:

*Attesting Officer*

DONALD J. QUIGG

*Commissioner of Patents and Trademarks*